(12) United States Patent
Fang et al.

(10) Patent No.: US 9,953,888 B1
(45) Date of Patent: Apr. 24, 2018

(54) ELECTROMAGNETIC DETECTION DEVICE AND SEMICONDUCTOR MANUFACTURING SYSTEM

(71) Applicant: Taiwan Semiconductor Manufacturing Co., Ltd., Hsinchu (TW)

(72) Inventors: Chung-Wei Fang, Hsinchu (TW); Yao-Fong Dai, Hsinchu (TW); Chih-Tung Lo, Hsinchu (TW); Ming-Hsien Tsai, Taoyuan (TW); Kai-Wen Wu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/379,958

(22) Filed: Dec. 15, 2016

(51) Int. Cl.
| | |
|---|---|
| *H01L 21/66* | (2006.01) |
| *H01F 27/28* | (2006.01) |
| *H02M 7/04* | (2006.01) |
| *G01R 29/08* | (2006.01) |
| *H01L 21/02* | (2006.01) |
| *C23C 16/505* | (2006.01) |

(52) U.S. Cl.
CPC .......... *H01L 22/26* (2013.01); *C23C 16/505* (2013.01); *G01R 29/0878* (2013.01); *H01F 27/28* (2013.01); *H01L 21/02274* (2013.01); *H02M 7/04* (2013.01)

(58) Field of Classification Search
CPC . H01L 22/26; H01L 21/02274; C23C 16/505; G01R 29/0878; H01F 27/28; H02M 7/04
See application file for complete search history.

(56) References Cited

U.S. PATENT DOCUMENTS

| | | | |
|---|---|---|---|
| 8,279,008 B2 | 10/2012 | Hsieh et al. | |
| 8,427,240 B2 | 4/2013 | Hsieh et al. | |
| 8,593,206 B2 | 11/2013 | Chen et al. | |
| 8,610,494 B1 | 12/2013 | Jin et al. | |
| 8,618,631 B2 | 12/2013 | Jin et al. | |
| 8,912,581 B2 | 12/2014 | Lin et al. | |
| 8,941,212 B2 | 1/2015 | Yen et al. | |

(Continued)

OTHER PUBLICATIONS

U.S. Appl. No. 14/921,205, filed Oct. 23, 2015.

(Continued)

*Primary Examiner* — Karen Kusumakar
(74) *Attorney, Agent, or Firm* — McClure, Qualey & Rodack, LLP (57) ABSTRACT

An electromagnetic detection device is provided. The electromagnetic detection device includes an induction coil, a converter, and a controller. The induction coil is utilized to sense an RF signal and generate a sensing RF signal by electromagnetic induction of the induction coil which is proportional to the RF signal. The RF signal is transmitted to a shower head to perform a semiconductor process on a wafer for manufacturing an IC in association with the RF signal. The converter is utilized to convert the sensing RF signal into a DC signal. The controller is utilized to determine whether the semiconductor process is normal or abnormal according to the DC signal during the semiconductor process. The semiconductor process will be terminated when the semiconductor process is determined as abnormal.

20 Claims, 5 Drawing Sheets

(56) References Cited

U.S. PATENT DOCUMENTS

| | | |
|---|---|---|
| 9,184,256 B2 | 11/2015 | Huang et al. |
| 9,209,521 B2 | 12/2015 | Hung et al. |
| 2002/0170678 A1* | 11/2002 | Hayashi ................ H01J 37/321 156/345.48 |
| 2004/0031699 A1* | 2/2004 | Shoji ................. H01J 37/32174 205/791.5 |
| 2007/0095286 A1* | 5/2007 | Baek ................... C23C 16/4412 118/719 |
| 2008/0011424 A1* | 1/2008 | Yin ................... H01J 37/32091 156/345.48 |
| 2011/0278260 A1* | 11/2011 | Lai .................... C23C 16/45565 216/68 |
| 2014/0132333 A1 | 5/2014 | Jin et al. |
| 2014/0253262 A1 | 9/2014 | Hsieh et al. |
| 2014/0253391 A1 | 9/2014 | Yen |
| 2015/0364417 A1 | 12/2015 | Lee et al. |
| 2016/0242124 A1* | 8/2016 | Zhou ................... G06K 7/0008 |
| 2016/0248394 A1 | 8/2016 | Chen et al. |

OTHER PUBLICATIONS

U.S. Appl. No. 14/927,783, filed Oct. 30, 2015.
U.S. Appl. No. 14/954,003, filed Nov. 30, 2015.
U.S. Appl. No. 14/969,309, filed Dec. 15, 2015.
U.S. Appl. No. 14/983,770, filed Dec. 30, 2015.
U.S. Appl. No. 15/007,515, filed Jan. 27, 2016.

\* cited by examiner

ELECTROMAGNETIC DETECTION DEVICE AND SEMICONDUCTOR MANUFACTURING SYSTEM

BACKGROUND

Thanks to continuous advances in semiconductor technology, accuracy and reliability are important requirements of each semiconductor manufacturing process. When a thin film is deposited over a wafer, an RF signal is usually utilized in association with plasma. If there is strap or deterioration in the circuit, the RF signal might not be transmitted properly, which is required if the semiconductor process is to be performed on the wafer. Therefore, an electromagnetic detection device and a semiconductor manufacturing system incorporating the same are needed to promptly detect RF signals.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

Figure 1:
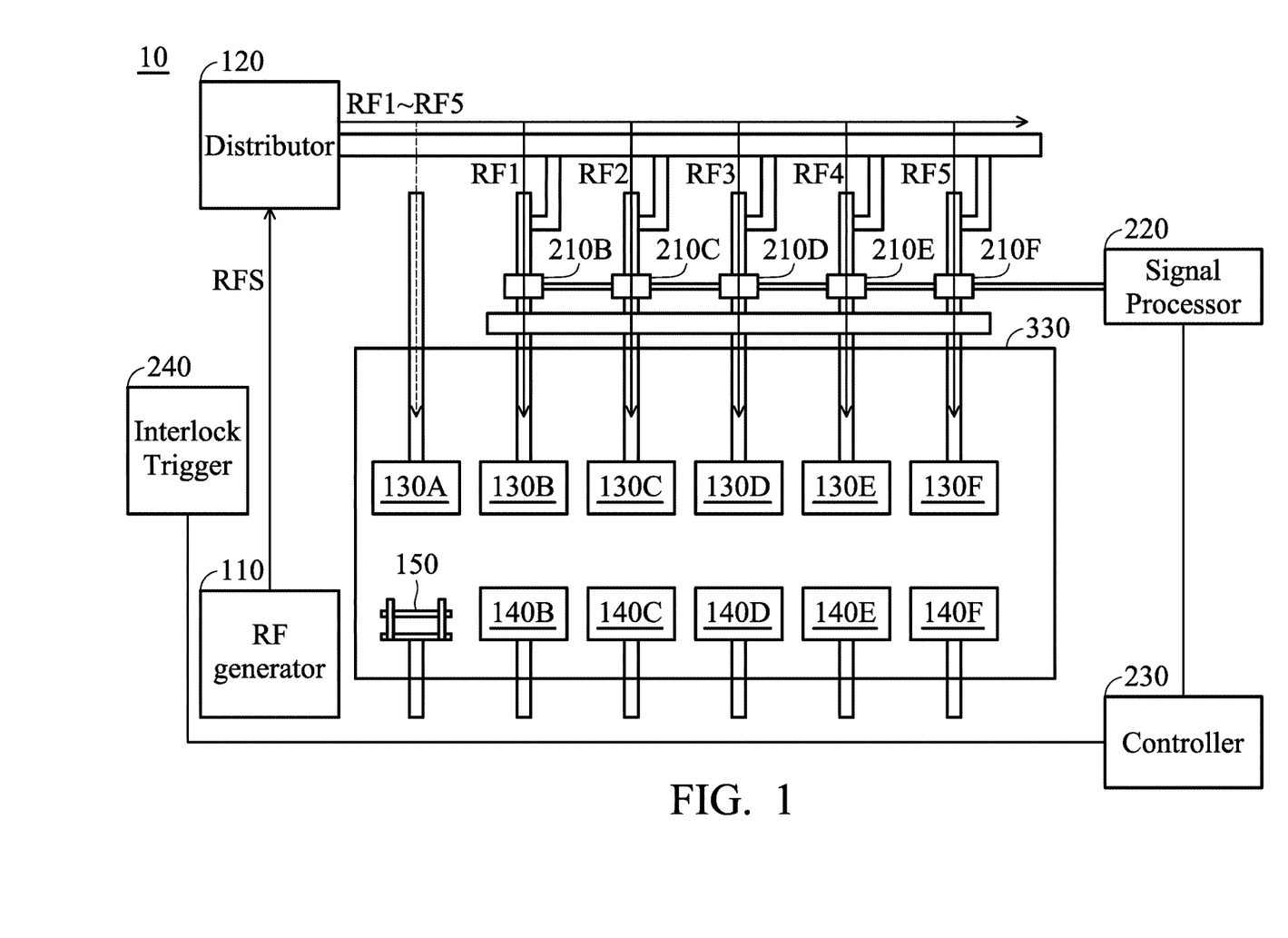
FIG. 1 is a schematic diagram of a semiconductor manufacturing system, in accordance with some embodiments.

FIG. 1 is a schematic diagram of a semiconductor manufacturing system 10, in accordance with some embodiments. The semiconductor manufacturing system 10 includes an RF generator 110, a distributor 120, several RF current sensors 210B~210F, a signal processor 220, a controller 230, and an interlock trigger 240.

The RF generator 110 generates an RF source signal RFS, and transmits the RF source signal RFS to the distributor 120. The distributor 120 distributes the RF source signal RFS into a number of RF signals RF1~RF5, and transmits the RF signals RF1~RF5 to the shower heads 130B~130F.

The shower heads 130A~130F, the holders 140B~140F, and the carry component 150 are arranged in the chamber 330. The shower heads 130B~130F generate chemical vapor to perform a semiconductor manufacturing process. The carry component 150 carries wafers (not shown) to the holders 140B~140F. As such, each of the holders 140B~140F holds and supports a respective wafer. In some embodiments, the holders 140B~140F are heaters to provide a specific temperature in the chamber 330 to perform the semiconductor manufacturing process.

In some embodiments, the RF signals RF1~RF5 are transmitted to the shower heads 130B~130F to form the thin film. Specifically, a Plasma Enhanced Chemical Vapor Deposition (PECVD) manufacturing process is executed in the chamber 330. In PECVD manufacturing processes, deposition is achieved by introducing reactant gases between parallel electrodes—a grounded electrode and an RF-energized electrode (not shown).

The RF signals RF1~RF5 are utilized to enhance the capacitive coupling between the parallel electrodes in order to excite the reactant gases into a plasma. The excitement of the reactant gases induces a chemical reaction and results in the reaction product being deposited on the wafer. Accordingly, thin films can be deposited from a gas state to a solid state on the wafer.

Moreover, five RF current sensors 210B~210F are coupled to the distributor 120 and the shower heads 130B~130F. Each of the RF current sensors 210B~210F is utilized to extract a portion of the RF signals RF1~RF5 respectively. Therefore, whether the RF signals RF1~RF5 properly pass through the RF current sensors 210B~210F or not can be detected according to the extracted portion of RF signals RF1~RF5.

In addition, the signal processor 220 converts the extracted portion of RF signals RF1~RF5 into DC signals. Afterwards, the controller 230 determines whether the semiconductor process has succeeded or not based on the DC signals. The controller 230 could include a digital signal processor (DSP), a microcontroller (MCU), a central-processing unit (CPU) or a plurality of parallel processors relating the parallel processing environment to implement the operating system (OS), firmware, driver and/or other applications.

When there is strap or deterioration in the path of the RF signal RF1, the voltage of the DC signal will decrease. Afterwards, the interlock alarm 240 will be initiated to stop the semiconductor process in order to clarify the reason for the abnormality of the semiconductor process.

Figure 2:
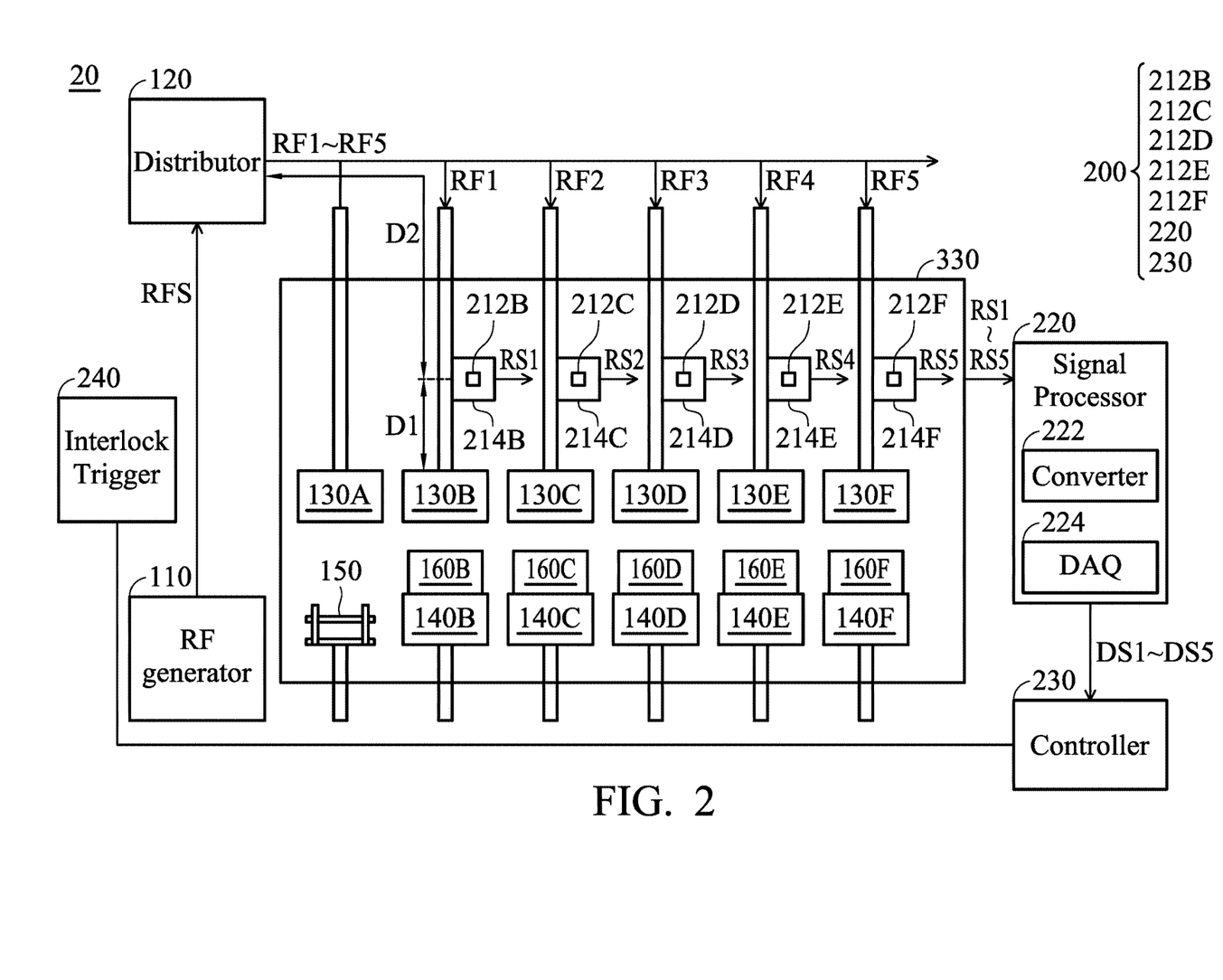
FIG. 2 is a schematic diagram of a semiconductor manufacturing system, in accordance with some embodiments.

FIG. 2 is a schematic diagram of a semiconductor manufacturing system 20, in accordance with some embodiments. The semiconductor manufacturing system 20 is utilized to perform a semiconductor process to manufacture an IC, such as depositing thin film on a wafer. In some embodiments, the semiconductor process is executed in association with RF signals, such as in the PECVD manufacturing process, in order to form thin film and manufacture an IC.

The semiconductor manufacturing system 20 includes an RF generator 110, a distributor 120, a number of a shower heads 130A~130F, an electromagnetic detection device 200 and an interlock trigger 240. Specifically, the electromagnetic detection device 200 includes a number of induction coils 212B~212F, the signal processor 220, the controller 230, and the interlock trigger 240.

The induction coils 212B~212F are arranged on the sensor boards 214B~214F. For example, the induction coil 212B is on the sensor board 214B, and the induction coil 212C is on the sensor board 214C.

In some embodiments, the induction coils 212B~212F are adjacent to the shower heads 130A~130F. In other words, the sensor boards 214B~214F are also adjacent to the shower heads 130A~130F. As shown in FIG. 2, a first distance D1 is arranged between the induction coil 212B and the shower head 130B, and a second distance D2 is arranged between the induction coil 212B and the distributor 120. The first distance D1 is shorter than the second distance D2.

Therefore, the induction coils 212B~212F sense the RF signals RF1~RF5 wirelessly without contact, and transmit the sensing RF signals RS1~RS5 to the signal processor 220.

It should be noted that the induction coils 212B~212F are not arranged in the middle part of the paths of the RF signals RF1~RF5, there are arranged close to the back end (i.e., the outlet) of the paths of the RF signals RF1~RF5. Because the induction coils 212B~212F are arranged near the outlets of the paths of the RF signals RF1~RF5, no matter which part of the paths of the RF signals RF1~RF5 (i.e., the inlet, the middle part, or the outlet of the paths of the RF signals RF1~RF5) contains the strap, the strap can be detected by the induction coils 212B~212F.

As shown in FIG. 2, the induction coils 212B~212F, the sensor boards 214B~214F, the shower heads 130A~130F, the holders 140B~140F, the carry component 150, and the wafers 160B~160F are arranged in the chamber 330.

The RF generator 110 generates an RF source signal RFS, and transmits the RF source signal RFS to the distributor 120. The distributor 120 distributes the RF source signal RFS into a number of RF signals RF1~RF5, and transmits the RF signals RF1~RF5 to the shower heads 130B~130F.

The distributor 120 is also utilized to match impedance for the RF generator 110, the shower heads 130A~130F, and the electromagnetic detection device 200. Therefore, the distributor can equally divide the RF source signal RFS into the RF signals RF1~RF5.

The shower heads 130A~130F, the holders 140B~140F and the carry component 150 are arranged in the chamber 330. In some embodiments, the shower heads 130B~130F generate chemical vapor to perform a semiconductor manufacturing process for manufacturing an integrated circuit (IC) based on the RF signals RF1~RF5.

The carry component 150 carries wafers 160B~160F to the holders 140B~140F. The wafer 160B is arranged on the holder 140B, the wafer 160C is arranged on the holder 140C, and the wafer 160F is arranged on the holder 140F.

In one embodiment, the electromagnetic detection device 200 is utilized to sense and detect the RF signals RF1~RF5 by their corresponding electromagnetic induction, in order to determine whether the semiconductor process is normal or abnormal during the semiconductor process.

Specifically, the induction coils 212B~212F are utilized to sense the RF signals RF1~RF5 individually and generate sensing RF signals RS1~RS5. The sensing RF signals RS1~RS5 are obtained based on the electromagnetic induction of the induction coils 212B~212F, and the sensing RF signals RS1~RS5 are proportional to the RF signals RF1~RF5.

In some embodiments, each of the induction coils 212B~212F is an inductor to sense the magnetic field of the RF signals RF1~RF5. Accordingly, the induction coils 212B~212F generate the sensing RF signals RS1~RS5 through the electromagnetic induction of the magnetic field of the RF signals RF1~RF5.

The sensing RF signals RS1~RS5 are not directly extracted from the RF signals RF1~RF5. The sensing RF signals RS1~RS5 are generated wirelessly by electromagnetic induction. Therefore, the power of the sensing RF signals RS1~RS5 is low (such as 10 W), which is much lower than the power of the RF current sensors 210B~210F of FIG. 1. The low power can protect the signal processor 220 from burning out, and therefore high reliability and safety can be obtained.

It should be noted that each of the sensing RF signals RS1~RS5 is generated individually and separately without interfering with each other. For example, the induction coil 212B senses the RF signal RF1 and generates the sensing RF signal RS1, and the induction coil 212C senses the RF signal RF2 and generates the sensing RF signal RS2. The electromagnetic induction of the induction coils 212B and 212C are performed respectively to avoid affecting other induction coils.

In addition, as shown in FIG. 2, the signal processor 220 includes a converter 222 and a data acquisition module (DAQ) 224. The signal processor 220, the controller 230 and the interlock trigger 240 could be arranged in another circuit board that is different from circuit boards 214B~214F. In some embodiments, the converter 222 includes at least one bridge rectifier and at least one low-pass filter (not shown).

The bridge rectifier includes four diodes to rectify the sensing RF signals RS1~RS5 which are alternative current (AC). The low-pass filter could include a capacitor and a diode to eliminate high-frequency noise. Therefore, the converter 222 is utilized to convert the sensing RF signals RS1~RS5 into a plurality of DC signals DS1~DS5.

In the embodiment of FIG. 2, there are five sensing RF signals RS1~RS5. The converter 222 includes five rectifiers, five low-pass filters and five grounds. Each rectifier has its own corresponding low-pass filter and its own corresponding ground. In other words, the quantity of grounds is identical to the quantity of induction coils 212B~212F.

By utilizing the converter 222 of FIG. 2, five sensing RF signals RS1~RS can be transformed into five DC signals DS1~DS5 individually to avoid interfering with each other. Therefore, the five DC signals DS1~DS5 can be isolated.

The DAQ 224 is utilized to accumulate the DC signals DS1~DS5. In some embodiments, the DAQ 224 is not arranged in the semiconductor manufacturing system 20. Specifically, the DAQ 224 is a differential circuit structure and includes a number of grounds. The quantity of grounds is identical to the quantity of induction coils 212B~212F. As such, interference between the DC signals DS1~DS5 can be avoided.

Afterwards, the DC signals DS1~DS5 are transmitted to the controller 230. The controller 230 determines whether the semiconductor process is normal or abnormal according to the DC signals DS1~DS5 during the semiconductor process.

In some embodiments, the controller 230 compares the DC signal with a threshold value. The controller 230 determines that the semiconductor process is normal when each of the DC signals DS1~DS5 is greater than the threshold value. The controller 230 determines that the semiconductor process is abnormal when one of the DC signals DS1~DS5 is less than or equal to the threshold value.

More specifically, the controller determines the threshold value by averaging a voltage value of the DC signal when the semiconductor process is normal and another voltage value of the DC signal when the semiconductor process is abnormal.

When an abnormal situation (such as a strap or circuit degradation) occurs on one of the paths of the RF signals RF1~RF5 (for example, RF signal RF2), this RF signal RF2 will be affected and cannot be properly transmitted to the shower head 130C. Consequently, the sensing RF signal RS2 sensed by the induction coil 212C will be weaker than the other four sensing RF signals RS1, RS3~RS5.

Accordingly, the value of the DC signal of sensing RF signal RF2 for the abnormal semiconductor process is lower than the value of the DC signal of sensing RF signal for the normal semiconductor process. Therefore, in some embodiments, the threshold value is determined by averaging the large value and the small value.

In some embodiments, the threshold value is an historical value which has been recorded in a database (not shown). The controller 230 receives the threshold value from the database and compares it with the DC signals DS1~DS5.

In addition, the threshold value depends on the parameters and conditions of the semiconductor process executed in the chamber 330. Many different threshold values can be recorded in association with parameters and conditions for manufacturing the IC.

When the controller 230 determines that the semiconductor process is abnormal, the interlock trigger 240 will be triggered to stop the semiconductor process in order to clarify the reason for the abnormal semiconductor process.

Specifically, when the interlock trigger 240 is initiated, the RF generator 110 will stop providing the RF source signal RFS. The RF signals RF1~RF5 will not be distributed and transmitted to the shower heads 130B~130F. Therefore, the semiconductor process in the chamber 330 is paused.

Afterwards, an alarm message will be provided by the interlock trigger, and the engineer will check the semiconductor manufacturing system 20 and rectify the abnormal situation after receiving the alarm message. The alarm message could be displayed on the monitor, so that the engineer can read the alarm message and clarify the reasons for the abnormal situation based on the alarm message.

Figure 3:
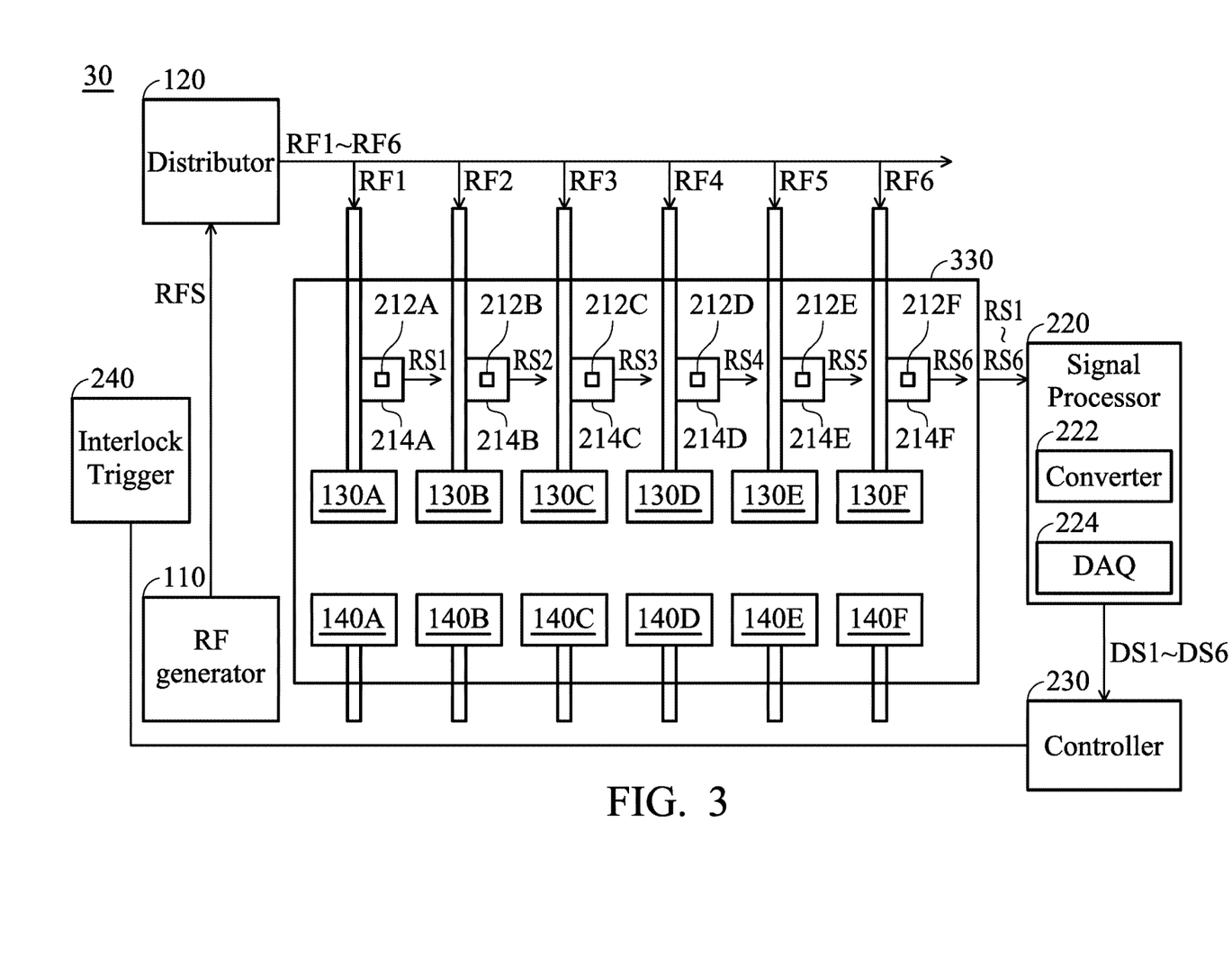
FIG. 3 is a schematic diagram of another semiconductor manufacturing system, in accordance with some embodiments.

FIG. 3 is a schematic diagram of another semiconductor manufacturing system 30, in accordance with some embodiments. The main difference between the embodiments of FIG. 2 and FIG. 3 is that the carrier component 150 is not arranged in the chamber.

As shown in FIG. 3, there are six induction coils 212A~212F, six shower heads 130A~130F and six holders 140A~140F. In other words, the quantity of induction coils 212A~212F is identical to the quantity of shower heads 130A~130F. The method by which the induction coils 212A~212F detect the RF signals RF1~RF6 and generate the sensing RF signals RS1~RS6 has been illustrated before, and will not be repeated again.

Figure 4:
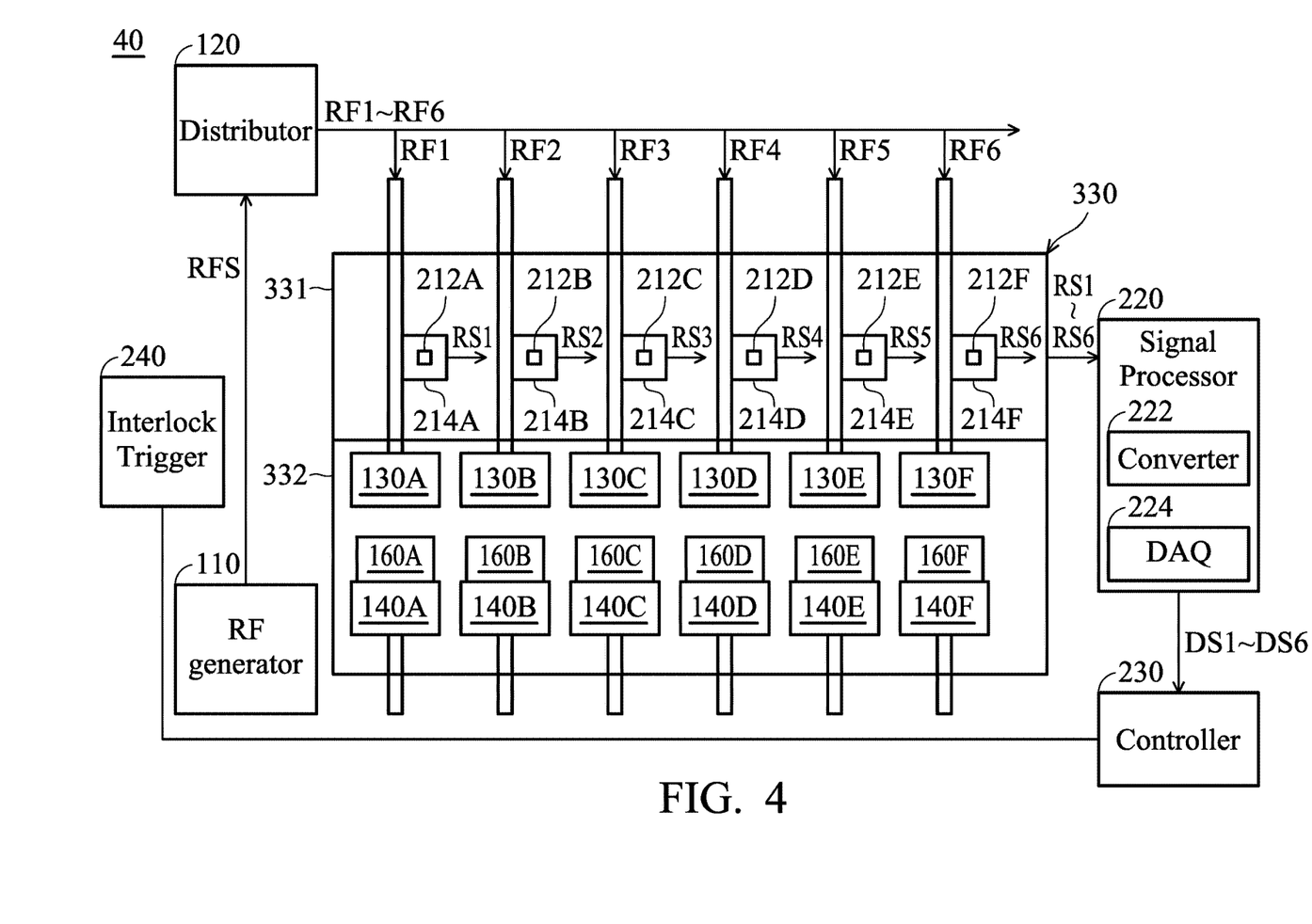
FIG. 4 is a schematic diagram of another semiconductor manufacturing system, in accordance with some embodiments.

FIG. 4 is a schematic diagram of another semiconductor manufacturing system 40, in accordance with some embodiments. The chamber 130 includes an air region 331 and a vacuum region 332. The gas pressure in the vacuum region 332 is lower than the gas pressure of the air region 331.

In some embodiments, the induction coils 212A~212F and the sensor boards 214A~214F are arranged in the air region 331. The shower heads 130A~130F, the holders 140A~140F and the wafers 160A~160F are arranged in the vacuum region 332. In other words, the semiconductor process of depositing the thin film is performed in the vacuum region 332.

Figure 5:
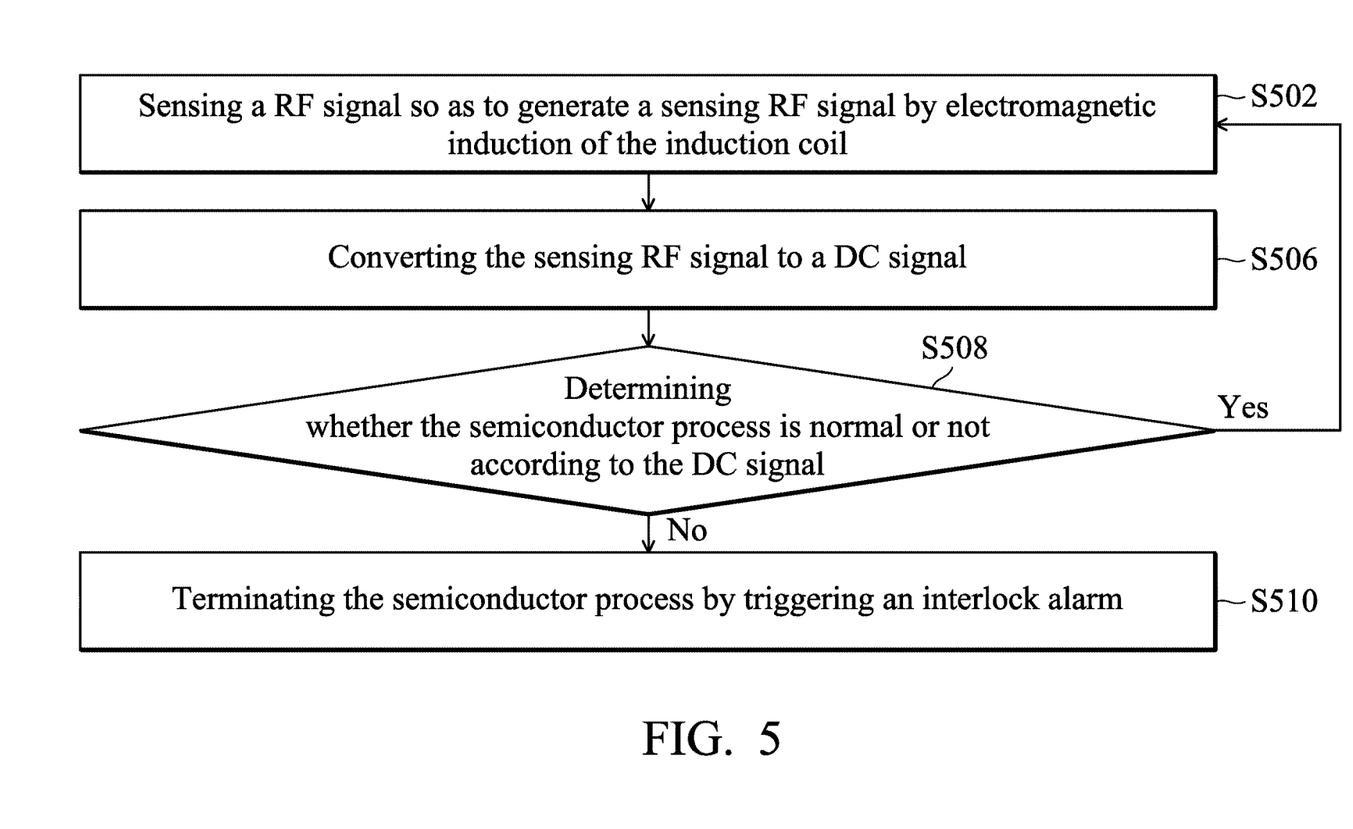
FIG. 5 is a flow chart of an electromagnetic detection method, in accordance with some embodiments.

FIG. 5 is a flow chart of an electromagnetic detection method, in accordance with some embodiments. In step S502, an RF signal is sensed by an induction coil so as to generate a sensing RF signal by electromagnetic induction of the induction coil. The RF signal is transmitted to a shower head to perform a semiconductor process on the wafer for manufacturing an IC in association with the RF signal. The sensing RF signal is proportional to the RF signal.

In step S506, the sensing RF signal is converted into a DC signal. The conversion of the sensing RF signal has been illustrated, and will not be repeated again. Afterwards, in step S508, a controller determines whether the semiconductor process is normal or not according to the DC signal. The controller compares the DC signal with a threshold value. The controller determines that the semiconductor process is normal when each of the DC signals is greater than the threshold value. The controller determines that the semiconductor process is abnormal when one of the DC signals is less than or equal to the threshold value.

If the semiconductor process is normal, step S502 will be executed. If the semiconductor process is abnormal, step S510 will be executed. In step S510, the semiconductor process is terminated by triggering an interlock alarm.

By utilizing the proposed electromagnetic detection device and electromagnetic detection method, the RF signals are sensed wirelessly by utilizing the electromagnetic induction effects of the induction coils. Because of the low power of the wireless sensing RF signals, high reliability and safety can be obtained. In addition, the induction coils are arranged to be closer to the shower head than to the distributor. Therefore, a strap or disconnection along the whole paths of the RF signals can be detected.

In accordance with some embodiments, an electromagnetic detection device is provided. The electromagnetic detection device includes an induction coil, a converter, and a controller. The induction coil is utilized to sense an RF signal and generate a sensing RF signal which is proportional to the RF signal by an electromagnetic induction of the induction coil. The RF signal is transmitted to a shower head, and the shower head is utilized to perform a semiconductor process on a wafer for manufacturing an IC in association with the RF signal. The converter is utilized to convert the sensing RF signal into a DC signal. The controller is utilized to determine whether the semiconductor process is normal or abnormal according to the DC signal during the semiconductor process. The semiconductor process will be terminated when the semiconductor process is determined as abnormal.

In accordance with some embodiments, a semiconductor manufacturing system is provided. The semiconductor manufacturing system includes a number of shower heads, a distributor, and an electromagnetic detection device. The shower heads are utilized to perform a semiconductor process on a wafer for manufacturing the IC based on a plurality of RF signals. The distributor is utilized to distribute an RF source signal from an RF generator into the RF signals, and transmit the RF signals to the shower heads. The electromagnetic detection device is utilized to sense the RF signals by their corresponding electromagnetic induction to determine whether the semiconductor process is normal or abnormal during the semiconductor process.

In accordance with some embodiments, an electromagnetic detection method is provided. The electromagnetic detection method includes sensing an RF signal by an induction coil. The RF signal is transmitted to a shower head, and the shower head is utilized to perform a semiconductor process on a wafer for manufacturing an IC in association with the RF signal. The electromagnetic detection method further includes generating a sensing RF signal which is proportional to the RF signal by an electromagnetic induction of the induction coil; converting the sensing RF signal into a DC signal; determining whether the semiconductor process is normal or abnormal according to the DC signal during the semiconductor process; and terminating the semiconductor process by triggering an interlock alarm when the semiconductor process is determined as abnormal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electromagnetic detection device, comprising:
  an induction coil, utilized to sense a radio-frequency (RF) signal and generate a sensing RF signal by electromagnetic induction of the induction coil which is proportional to the RF signal, wherein the RF signal is transmitted to a shower head from a distributor, and the shower head is utilized to perform a semiconductor process on a wafer for manufacturing an integrated circuit (IC) in association with the RF signal, a first distance is arranged between the induction coil and the shower head, a second distance is arranged between the induction coil and the distributor, and the first distance is shorter than the second distance;
  a converter, utilized to convert the sensing RF signal into a DC signal; and
  a controller, utilized to determine whether the semiconductor process is normal or abnormal according to the DC signal during the semiconductor process, wherein the semiconductor process will be terminated when the semiconductor process is determined as abnormal.

2. The electromagnetic detection device as claimed in claim 1, wherein the distributor is utilized to distribute an RF source signal from an RF generator into the RF signal and transmit the RF signal to the shower head.

3. The electromagnetic detection device as claimed in claim 1, wherein the semiconductor process forms a thin film on the wafer, and the RF signal is utilized to enhance chemical vapor deposition to form the thin film.

4. The electromagnetic detection device as claimed in claim 1, wherein the induction coil, the shower head and the wafer are arranged in a chamber.

5. The electromagnetic detection device as claimed in claim 4, wherein the induction coil is arranged in an air region of the chamber, and the shower head and the wafer are arranged on a vacuum region of the chamber.

6. The electromagnetic detection device as claimed in claim 1, wherein the induction coil is an inductor to sense a magnetic field of the RF signal, and to generate the sensing RF signal through the electromagnetic induction of the magnetic field.

7. The electromagnetic detection device as claimed in claim 1, wherein the converter comprises a bridge rectifier and a low-pass filter.

8. The electromagnetic detection device as claimed in claim 1, wherein the controller compares the DC signal with a threshold value, and determines that the semiconductor process is normal when the DC signal is greater than the threshold value, and determines that the semiconductor process is abnormal when the DC signal is less than or equal to the threshold value.

9. The electromagnetic detection device as claimed in claim 8, wherein the threshold value is determined by averaging a voltage value of the DC signal when the semiconductor process is normal and another voltage value of the DC signal when the semiconductor process is abnormal.

10. A semiconductor manufacturing system for manufacturing an integrated circuit (IC), comprising:
  a plurality of shower heads, utilized to perform a semiconductor process on a wafer for manufacturing the IC based on a plurality of radio-frequency (RF) signals;
  a distributor, utilized to distribute an RF source signal from an RF generator into the RF signals, and transmit the RF signals to the shower heads; and
  an electromagnetic detection device, utilized to sense the RF signals by their corresponding electromagnetic inductions to determine whether the semiconductor process is normal or abnormal during the semiconductor process, and when the semiconductor process is determined as abnormal, an interlock alarm is trigger to terminate the semiconductor process.

11. The semiconductor manufacturing system as claimed in claim 10, wherein the electromagnetic detection device comprises a plurality of induction coils to sense the magnetic fields of the RF signals, and generate a plurality of sensing RF signals through the electromagnetic inductions of the magnetic fields.

12. The semiconductor manufacturing system as claimed in claim 11, wherein quantity of induction coils is identical to quantity of shower heads, the induction coils are arranged between the distributor and the shower heads, a first distance is arranged between the induction coils and the shower heads, a second distance is arranged between the induction coils and the distributor, and the first distance is shorter than the second distance.

13. The semiconductor manufacturing system as claimed in claim 10, wherein the semiconductor process is forming a thin film on the wafer, and the RF signals are utilized to enhance chemical vapor deposition to form the thin film.

14. The semiconductor manufacturing system as claimed in claim 11, wherein the electromagnetic detection device comprises a converter to convert the sensing RF signals into a plurality of DC signals, and the converter comprises a plurality of grounds which are identical to the quantity of induction coils.

15. The electromagnetic detection system as claimed in claim 11, wherein the induction coils are inductors to sense a magnetic field of the RF signal, and to generate the sensing RF signals through the electromagnetic induction of the magnetic field.

16. The semiconductor manufacturing system as claimed in claim 10, wherein the electromagnetic detection device comprises a controller to compare each of the DC signals with a threshold value, and determines that the semiconductor process is normal when each of the DC signal is greater than the threshold value, and determines that the semiconductor process is abnormal when at least one of the DC signal is less than or equal to the threshold value.

17. An electromagnetic detection method, comprising:
sensing a radio-frequency (RF) signal by an induction coil so as to generate a sensing RF signal by an electromagnetic induction of the induction coil, wherein the RF signal is transmitted to a shower head, and the shower head is utilized to perform a semiconductor process on a wafer for manufacturing an integrated circuit (IC) in association with the RF signal, and the sensing RF signal is proportional to the RF signal, and the induction coils, the shower heads and the wafer are arranged in a chamber, the induction coils are arranged in an air region of the chamber, the shower heads and the wafer are arranged on a vacuum region of the chamber;
converting the sensing RF signal into a DC signal;
determining whether the semiconductor process is normal or abnormal according to the DC signal during the semiconductor process; and
terminating the semiconductor process by triggering an interlock alarm when the semiconductor process is determined as abnormal.

18. The electromagnetic detection method as claimed in claim 17, further comprising comparing the DC signal with a threshold value, and determining that the semiconductor process is normal when the DC signal is greater than the threshold value, and determining that the semiconductor process is abnormal when the DC signal is less than or equal to the threshold value.

19. The electromagnetic detection method as claimed in claim 17, wherein the semiconductor process forms a thin film on the wafer, and the RF signal is utilized to enhance chemical vapor deposition to form the thin film.

20. The electromagnetic detection method as claimed in claim 17, further comprising, after terminating the semiconductor process by triggering an interlock alarm when the semiconductor process is determined as abnormal, providing an alarm message by an interlock trigger, and checking the abnormal semiconductor process based on the alarm message.

* * * * *